US008309927B2

(12) United States Patent
Kimura et al.

(10) Patent No.: US 8,309,927 B2
(45) Date of Patent: Nov. 13, 2012

(54) INFRARED DETECTOR

(75) Inventors: Norio Kimura, Kanagawa (JP); Shigeo Masai, Osaka (JP); Yasuhiro Nakanosai, Kanagawa (JP)

(73) Assignee: Panasonic Corporation, Osaka (JP)

( * ) Notice: Subject to any disclaimer, the term of this patent is extended or adjusted under 35 U.S.C. 154(b) by 359 days.

(21) Appl. No.: 12/763,803

(22) Filed: Apr. 20, 2010

(65) Prior Publication Data

US 2011/0057106 A1     Mar. 10, 2011

(30) Foreign Application Priority Data

Sep. 8, 2009 (JP) ................. 2009-206641

(51) Int. Cl.
 *G01J 5/00*     (2006.01)
(52) U.S. Cl. .................................... 250/338.3
(58) Field of Classification Search ............... 250/338.3
See application file for complete search history.

(56) References Cited

U.S. PATENT DOCUMENTS

| 4,418,335 | A | 11/1983 | Genähr |
| 4,825,079 | A | 4/1989 | Takamatsu et al. |
| 4,882,491 | A | 11/1989 | Tamura et al. |
| 5,949,072 | A | 9/1999 | Takada et al. |
| 2004/0149910 | A1 | 8/2004 | Hatatani et al. |
| 2007/0279215 | A1* | 12/2007 | Tomooka et al. ............ 340/522 |

FOREIGN PATENT DOCUMENTS

JP          10-281866          10/1998

OTHER PUBLICATIONS

SPIE vol. 62, 1975 Infrared Technology, "Performance and Uses of High Speed Pyroelectric Detectors."

* cited by examiner

*Primary Examiner* — David Porta
*Assistant Examiner* — Hugh H Maupin
(74) *Attorney, Agent, or Firm* — McDermott Will & Emery LLP

(57) ABSTRACT

An infrared detector includes a pyroelectric element, a first amplifier, and a second amplifier. The pyroelectric element includes a first electrode formed on a first surface of a pyroelectric body, and a second electrode formed on the opposite surface. The first amplifier is connected to the first electrode, and amplifies signals induced to the first electrode. The second amplifier is connected to the second electrode, and amplifies signals induced to the second electrode.

18 Claims, 7 Drawing Sheets

INFRARED DETECTOR

CROSS-REFERENCE TO RELATED APPLICATION

This application claims priority to Japanese Patent Application No. 2009-206641 filed on Sep. 8, 2009, the disclosure of which including the specification, the drawings, and the claims is hereby incorporated by reference in its entirety.

BACKGROUND

The present disclosure relates to infrared detectors, and more particularly to pyroelectric infrared detectors outputting balanced signals.

A pyroelectric infrared detector includes a pyroelectric element made of a pyroelectric material. The pyroelectric material is one type of dielectric material. If the temperature of the pyroelectric material itself changes in accordance with a change in energy of infrared light incident on the pyroelectric body, the amount of charge (induced charge) on both of a front and back surfaces of the pyroelectric body is changed. If electrodes are provided on the both surfaces of the pyroelectric body, and a load is connected between the electrodes, the induced charge flows through the load as a current (a pyroelectric current). Voltage mode operation by high load resistance connected between electrodes, and current (charge) mode operation for detecting a pyroelectric current by low load resistance are generally used in a pyroelectric infrared detector.

Pyroelectric infrared detectors are widely used as detectors in proximity sensors for human body detection. In general, a human body is considered as a thermal radiation source of about 310 K. If a pyroelectric element has an area of several mm per side, a change in input energy to the pyroelectric element due to the human body is considered to be about 10 $\mu$W. If a conventional pyroelectric element made of a pyroelectric material such as lead titanate ($PbTiO_3$) or lead zirconate titanate (PZT), the amount of charge generated in the pyroelectric element changes by about 0.1 pC with the change in the input energy of about 10 $\mu$W. The change in the charge amount is about 1 mV, if calculated in terms of a change in a voltage between two electrodes of the pyroelectric element. As such, a signal generated in the pyroelectric element is extremely weak. Therefore, pyroelectric infrared detectors are required to have good resistance to external noise. As major external noise, noise introduced into a pyroelectric element and a signal extraction circuit, and noise introduced into a transmission path of the extracted signal are considered.

As a method of extracting a signal from the pyroelectric element, there is, for example, a method of converting to a voltage, a pyroelectric current being a time rate of an induced charge using a feedback capacitor of an amplifier. The reason for this is considered to be that a capacitor of the pyroelectric element and the feedback capacitor amplify the induced charge. There is also a method of connecting a high-resistance resistor to a pyroelectric element to extract voltages at both ends of the resistor as signal voltages via a source follower buffer of a FET (see, e.g., Japanese Patent Publication No. H10-281866).

SUMMARY

However, in the conventional method of extracting signals from the pyroelectric element, when external noise is mixed into the connecting portion of the pyroelectric element and the signal extraction portion, the noise is directly extracted. Also, the external noise is mixed into a signal line when the extracted signal is transmitted. Furthermore, one of the two electrodes of the pyroelectric element is connected to a reference potential (i.e., ground), and thus, charges induced into the both electrodes cannot be effectively utilized.

Note that, in the present disclosure, not all the problems described above need to be necessarily solved, and it is sufficient to solve at least one of the problems. Moreover, in the present disclosure, not all the objectives described below are necessarily achieved, and it is sufficient to achieve at least one of the objectives.

It is an objective of the present disclosure to realize a pyroelectric infrared detector, which reduces noise mixed into a pyroelectric element, and obtains high-quality signals.

Specifically, an example infrared detector includes at least one pyroelectric element including a first electrode formed on a first surface of a pyroelectric body, and a second electrode formed on a surface opposite to the first electrode; a first amplifier connected to the first electrode, and amplifying signals induced to the first electrode; and a second amplifier connected to the second electrode, and amplifying signals induced to the second electrode.

The example infrared detector amplifies a signal charge of the first electrode with the first amplifier, and a signal charge of the second electrode with the second amplifier. The signal charge appearing on the first electrode and the signal charge appearing on the second electrode are complementary charges. On the other hand, external noise mixed into the pyroelectric element is in the same phase. Therefore, by performing subtraction between outputs of the first amplifier and the second amplifier, the magnitude of signals can be doubled, and the noise can be reduced by $\sqrt{2}$ times. As a result, a pyroelectric infrared detector having signals of large magnitude and reduced noise can be realized.

The example infrared detector may include a substrate, a pyroelectric element mounted on the substrate, and a cap covering the pyroelectric element. The cap may include an infrared transmissive window through which infrared light is transmitted to the pyroelectric element.

The example infrared detector may include a substrate; a pyroelectric element mounted on the substrate; and a cap covering the pyroelectric element. The substrate may include an infrared transmissive window through which infrared light is transmitted to the pyroelectric element.

Since the example infrared detector includes the pyroelectric element housed in the case including the cap and the substrate, external noise can be prevented from reaching the pyroelectric element.

BRIEF DESCRIPTION OF THE DRAWINGS

FIG. 4A is a top view. FIG. 4B is a cross-sectional view taken along the line IVb-IVb in FIG. 4A. FIG. 4C is a bottom view.

FIG. 5A is a top view. FIG. 5B is a cross-sectional view taken along the line Vb-Vb in FIG. 5A. FIG. 5C is a bottom view.

DETAILED DESCRIPTION

Figure 1:
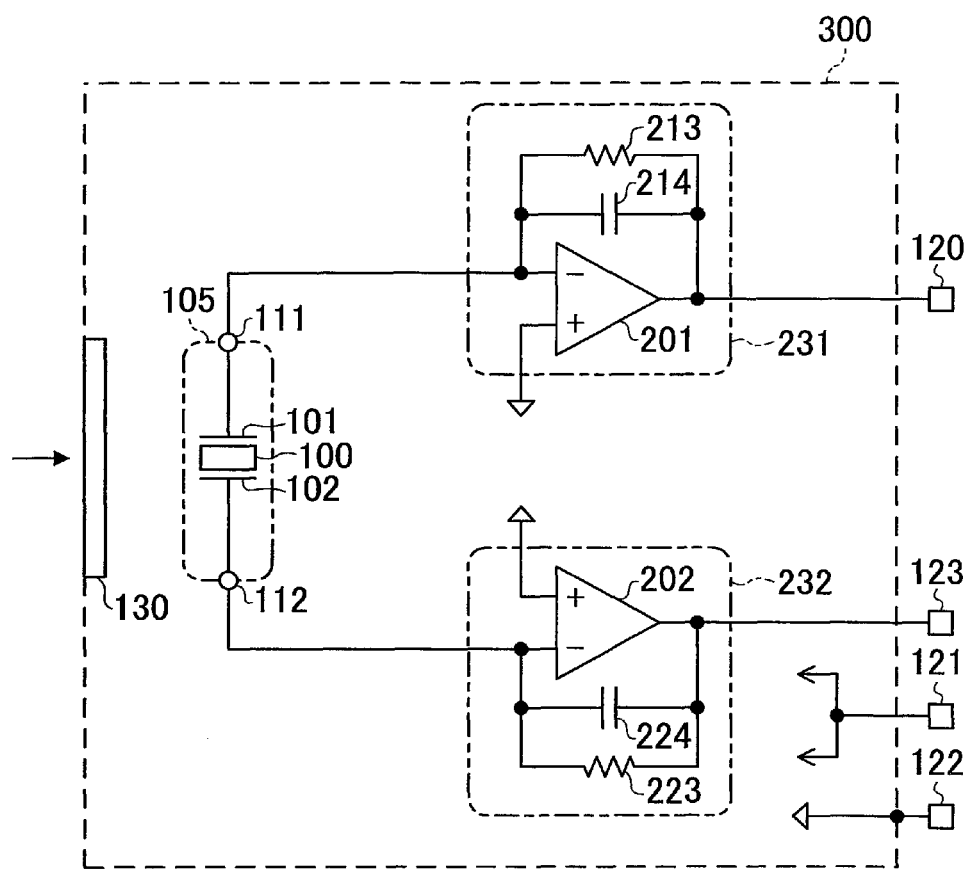
FIG. 1 is a circuit diagram illustrating an example infrared detector.

The materials and numerical values used in this embodiment are merely preferable examples, and the scope of the present disclosure is not limited to this embodiment. The present embodiment can be practiced with modification and alteration within the spirit and scope of the present disclosure.
Circuit Configuration FIG. 1 illustrates an equivalent circuit of an example pyroelectric infrared detector outputting balanced signals. As shown in FIG. 1, the example infrared detector includes a pyroelectric element 105, a first amplifier 201, and a second amplifier 202. The pyroelectric element 105 is a capacitive element, which includes a pyroelectric body 100, a first electrode 101 provided on a first surface (e.g., the front surface) of the pyroelectric body, and a second electrode 102 provided on the opposite surface (e.g., the back surface) to the first electrode 101.

The pyroelectric body 100 may be ferroelectrics having pyroelectric properties and is manipulated to have spontaneous polarization. It may be made of, for example, lead titanate (PbTiO$_3$) or lead zirconate titanate (PZT). When the pyroelectric body 100 absorbs infrared energy as heat to change the temperature, the magnitude of the spontaneous polarization of the pyroelectric body 100 is changed, thereby inducing charges to the first electrode 101 and the second electrode 102. A first signal charge induced to the first electrode 101 is input to an inverting input terminal of the first amplifier 201 via a first electrode terminal 111. A second signal charge induced to the second electrode 102 is input to an inverting input terminal of the second amplifier 202 via a second electrode terminal 112. A non-inverting input terminal of the first amplifier 201, and a non-inverting input terminal of the second amplifier 202 are connected to a reference potential (ground). The first amplifier 201 amplifies the first signal charge, and the second amplifier 202 amplifies the second signal charge. The first amplifier 201 and the second amplifier 202 may have the same capabilities. The first amplifier 201 and the second amplifier 202 are preferably high-input impedance amplifiers, and may be particularly of a complementary metal oxide semiconductor (CMOS) type. The amplifiers may also be of a type using two positive and negative power supplies as a power supply for operation. The amplifiers are more preferably of a high-input impedance CMOS type, which operates with a single power supply.

A feedback resistor 213 connected to the first amplifier 201, and a feedback resistor 223 connected to the second amplifier 202 are discharging resistors for preventing the respective amplifiers from being saturated. A feedback capacitor 214 connected to the first amplifier 201, and a feedback capacitor 224 connected to the second amplifier 202 determine the degree of amplification of charges. The first amplifier 201, the feedback resistor 213, and the feedback capacitor 214 constitute a first capacitively connected charge amplifier 231. The second amplifier 202, the feedback resistor 223, and the feedback capacitor 224 constitute a second capacitively connected charge amplifier 232.

An output terminal of the first amplifier 201 is connected to a first balanced output terminal 120, and an output terminal of the second amplifier 202 is connected to a second balanced output terminal 123. A voltage (power) supply terminal 121 supplying voltages to the first amplifier 201 and the second amplifier 202, and a ground terminal 122 supplying a reference potential are provided. The ground terminal 122 is also connected to a case 300, which also serves as a shield. This configuration is advantageous in reducing entry of external electromagnetic noise.

The case 300 includes an infrared transmissive window 130. The infrared transmissive window 130 includes an opening provided in the case 300, and a member bonded to the opening and transmitting infrared light. The infrared transmissive window 130 shields visible light, and guides infrared light to the pyroelectric element 105. The infrared transmissive window 130 may be configured to select a wavelength range to be detected. Since the wavelength of infrared light emitted from a human body is around 10 μm, the infrared transmissive window 130 may be, for example, formed with the use of silicon, which transmits infrared light having a wavelength ranging from about 2 μm to about 15 μm.

Figure 2:
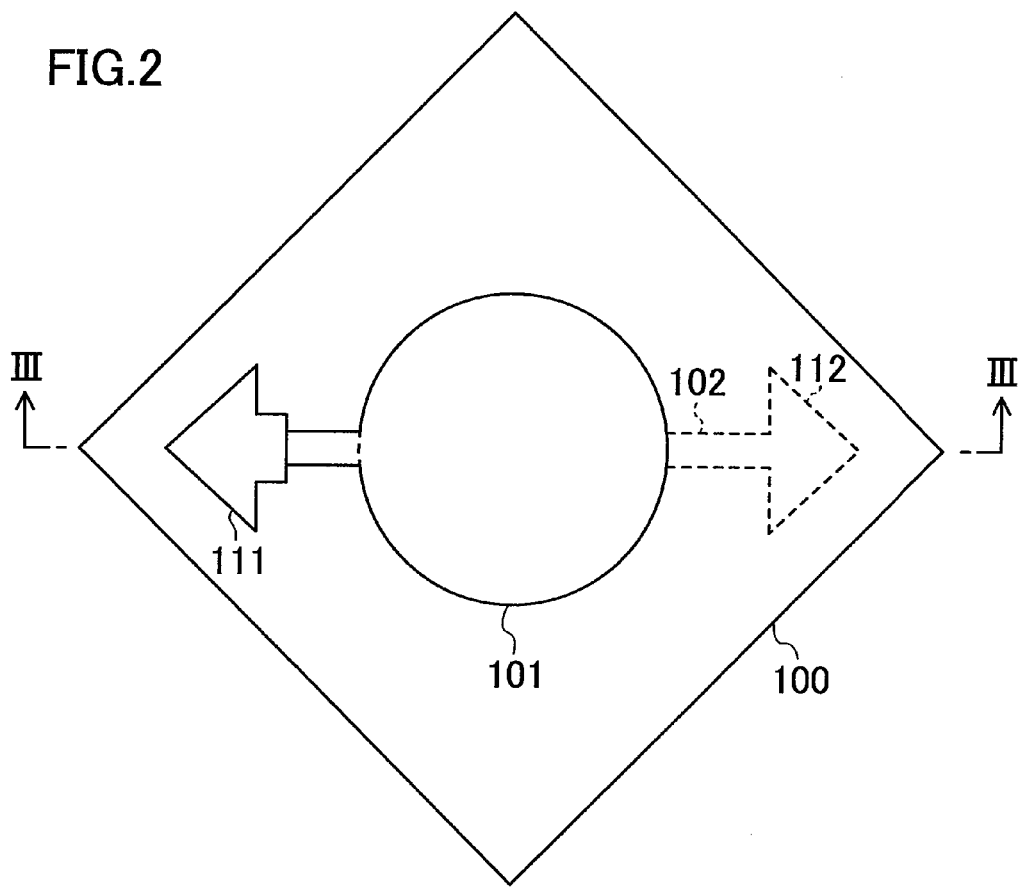
FIG. 2 is a plan view of an example pyroelectric element.
Figure 3:
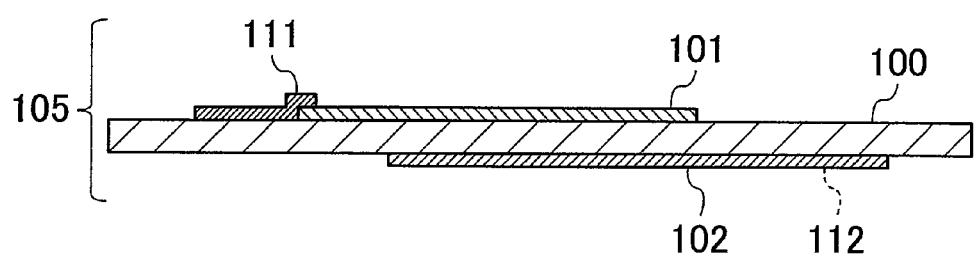
FIG. 3 is a cross-sectional view taken along the line in FIG. 2.

FIGS. 2 and 3 illustrate an example of the pyroelectric element 105. FIG. 2 is a plan view. FIG. 3 is a cross-sectional view taken along the line in FIG. 2. As shown in FIGS. 2 and 3, the pyroelectric element 105 includes a pyroelectric body 100 made of ferroelectric ceramic. The pyroelectric body 100 is a piece of element formed by polishing ceramic such as PZT, which is a pyroelectric material, of which polarization characteristics are manipulated. The first electrode 101 is formed on one of the surfaces (e.g., the front surface) of the pyroelectric body 100, and the second electrode 102 is vapor-deposited on the opposite surface (e.g., the back surface) of the first electrode 101. The first electrode 101 may be formed by vapor-depositing gold black, nichrome, or the like to increase heat absorption efficiency. A part of the first electrode 101 is the first electrode terminal 111, on which a metal film of, e.g., aluminum or gold, is vapor-deposited. A metal film of, e.g., aluminum or gold, is vapor-deposited on the entire surface of the second electrode 102. A part of the surface of the second electrode 102 is the second electrode terminal 112. When forming the pyroelectric element 105, processing and polishing are performed so that the direction of the spontaneous polarization of the pyroelectric body 100 is along an electrode plane.

The pyroelectric element 105 has a typical size of several mm per side, and a thickness of about 50 μm. The capacitance Cm [F] of the pyroelectric element 105 depends on the area of the first electrode 101, the thickness of the pyroelectric body 100, and inherent properties of the material of the pyroelectric body 100; and is represented by the following expression (1).

$$C_m = \frac{\varepsilon_0 \varepsilon_s A}{t} \quad (1)$$

Note that $\varepsilon_0$ [F/m] represents the dielectric constant of a vacuum, $\varepsilon_s$ represents the relative dielectric constant of the pyroelectric body 100, A [m$^2$] represents the area of the electrode, and t [m] represents the thickness of the pyroelectric body 100.

Next, operation of the pyroelectric element 105 will be described below. At a constant temperature, a charge on the first electrode 101, which is generated by internal spontaneous polarization of the pyroelectric element 105, traps a floating charge in the atmosphere to be electrically balanced. Therefore, the total charge amount $\Sigma Q_{front}$ of the first electrode 101, and the total charge amount $\Sigma Q_{back}$ of the second electrode are balanced at zero.

When the pyroelectric element 105, which is balanced at the time t0, absorbs infrared energy, the temperature of the pyroelectric element 105 changes by ΔT [K] during the time Δt. Until the portion reaches another balanced state, charges (pyroelectric charges)++Δq [C] and −Δq [C] appear on the first electrode 101 and the second electrode 102 due to pyroelectric effects. The charges +Δq [C] and −Δq [C] are represented by expressions (2) and (3). Note that λ [C/m²K] represents a pyroelectric coefficient of the pyroelectric body, A [m²] represents the area of the electrode, and ΔT [K] represents the temperature change of the pyroelectric element 105 at time Δt [sec].

$$+\Delta q[C] = +\lambda \cdot A \cdot \Delta T \quad (2)$$

$$-\Delta q[C] = -\lambda \cdot A \cdot \Delta T \quad (3)$$

As such, signal charges are induced both of the first electrode 101 and the second electrode 102 of the pyroelectric element 105. However, in a conventional device, one of electrodes is connected to ground, signal charges of only one of the electrodes are utilized. That is, the charge usage (efficiency) is considered to be 50%. It has not been considered effectively utilizing signal charges induced to both of electrodes. The example infrared detector effectively utilizes signal charges, which are induced to the both electrodes of the pyroelectric element 105. Since the first electrode 101 and the second electrode 102 are not connected to ground, the example infrared detector has the charge usage efficiency of almost 100%, i.e., about twice as much output as in the conventional device.

Outputs of the first balanced output terminal 120 and the second balanced output terminal 123 where the pyroelectric element 105 is a signal source will be described below. The first amplifier 201 and the second amplifier 202 constitute an inverting capacitively coupled charge amplifier. Therefore, as in a conventional inverting amplifier, a virtual short circuit occurs between the inverting input terminal and the non-inverting input terminal of the first amplifier 201, and between the inverting input terminal and the non-inverting input terminal of the second amplifier 202. Due to this virtual short circuit, input impedance of the inverting input terminals of the first amplifier 201 and the second amplifier 202 becomes infinite, and no current flows into the inverting input terminals of the first amplifier 201 and the second amplifier 202. Also, due to the virtual short circuit, the second electrode terminal 112 is virtually connected to ground, and thus, the second amplifier 202 does not affect the first amplifier 201. Similarly, the first electrode terminal 111 is virtually connected to ground, and thus, the first amplifier 201 does not affect the second amplifier 202. Therefore, a charge on the first electrode 101 flows into the feedback capacitor 214 and the feedback resistor 213, and a charge on the second electrode 102 flows into the feedback capacitor 224 and the feedback resistor 223.

An output signal $\Delta v_{120}$ of the first balanced output terminal 120 and an output signal $\Delta v_{123}$ of the second balanced output terminal 123 are represented by the signal charge and capacitance of the pyroelectric element 105 as shown in expressions (4) and (5), respectively. Note that $C_f$ represents capacitance of the feedback capacitor 214 and the feedback capacitor 224, $R_f$ represents resistance of the feedback resistor 213 and the feedback resistor 223, and $\Delta v = A\lambda\Delta T/C_m$.

$$-\frac{(+A\lambda\Delta T)}{C_f} = -\frac{C_m}{C_f}\Delta v \quad (4)$$

$$-\frac{(-A\lambda\Delta T)}{C_f} = +\frac{C_m}{C_f}\Delta v \quad (5)$$

Since the feedback resistor and the feedback capacitor form a low cut-off filter, the expressions (4) and (5) are effective in a region having a higher frequency than a cut-off frequency $f_{cut}$ represented by the following expression (6). The low cut-off frequency $f_{cut}$ may be determined taking into account the used bandwidth of the infrared detector.

$$f_{cut}[Hz] = \frac{1}{2\pi C_f R_f} \quad (6)$$

As clear from the expressions (4) and (5), complementary signals corresponding to complementary signal charges (signal charges, which are opposite in phase and the same in magnitude) induced to the first electrode 101 and the second electrode 102 are output to the first balanced output terminal 120 and the second balanced output terminal 123, respectively. If the complementary signals are balanced (subtracted), signals of doubled magnitude can be obtained, and external noise in the same phase, which is input to the infrared detector can be cancelled or reduced.

Then, noise appearing at the first balanced output terminal 120 and the second balanced output terminal 123 will be described below. Due to the virtual short circuit, the second amplifier 202 does not affect the first amplifier 201. Also, the first amplifier 201 does not affect the second amplifier 202. Thus, noise appearing at the first balanced output terminal 120 is caused by capacitance $C_m$ of the pyroelectric element, noise of the first amplifier 201, the feedback capacitance $C_f$, and the feedback resistance $R_f$. Also, noise appearing at the second balanced output terminal 123 is caused by capacitance $C_m$ of the pyroelectric element, noise of the second amplifier 202, the feedback capacitance $C_f$, and the feedback resistance Rf. Since the causes of the noise appearing at the first balanced output terminal 120 and at the second balanced output terminal 123 are the same, the noise has the same magnitude. Thus, the magnitude of signals can be doubled after the subtraction, and √2 times of noise can be obtained. Therefore, the signal-to-noise ratio is improved by √2 times (3 dB), and a high quality balanced signal can be supplied.

Mounting Configuration

Figure 4A:
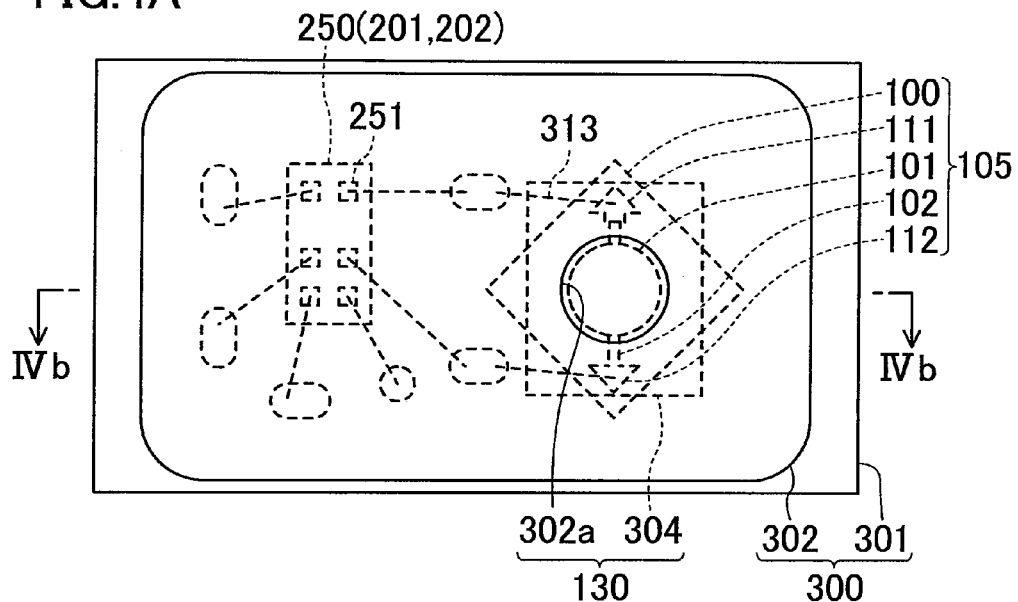
FIGS. 4A-4C illustrate the example infrared detector.
Figure 4B:
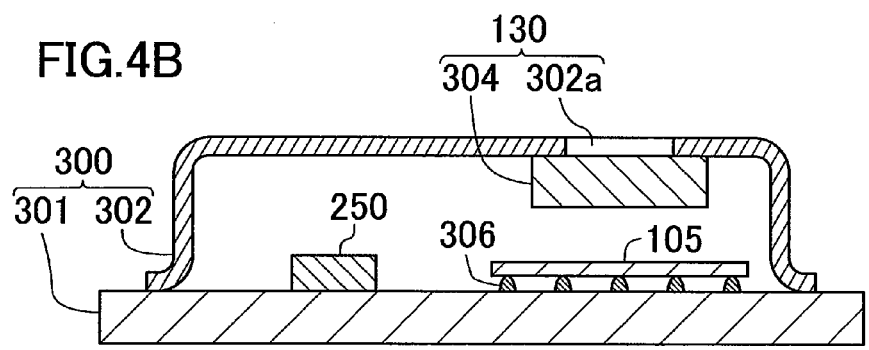
Figure 4C:
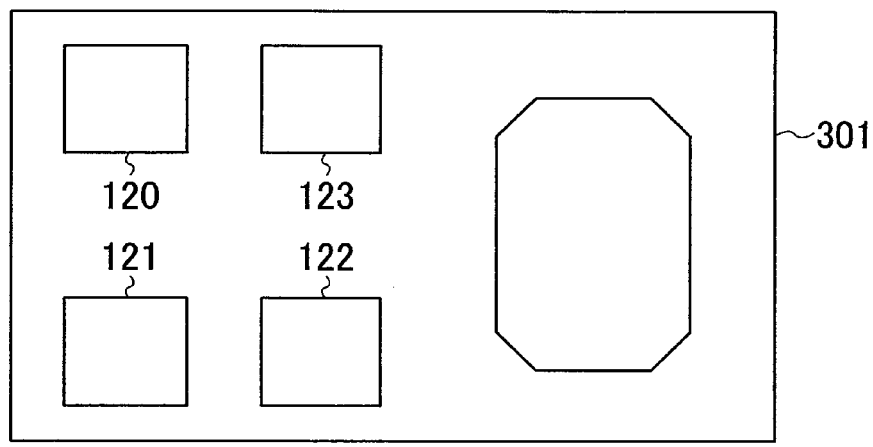

Next, the mounting configuration of the example infrared detector will be described below. FIGS. 4A-4C illustrate the example infrared detector. FIG. 4A is a plan view from above. FIG. 4B is a cross-sectional view taken along the line IVb-IVb in FIG. 4A. FIG. 4C is a plan view from below.

As shown in FIGS. 4A-4C, the example infrared detector includes the case 300 housing the pyroelectric element 105 and amplifiers. The case 300 includes a printed circuit board 301 mounting the pyroelectric element 105 and the amplifiers, and a metal cap 302, which is a cover for the printed circuit board 301. The pyroelectric element 105 and an integrated circuit (IC) 250, in which the first amplifier 201 and the second amplifier 202 are integrated together, are mounted on a first surface (e.g., the front surface) of the printed circuit board 301 by an adhesive. Ends of the pyroelectric element 105 are held by holders 306, which are formed by a plurality of insulations and are fixed between the back surface of the pyroelectric element 105 and the printed circuit board 301 to be spaced apart from each other. Depending on a method of holding the pyroelectric element 105, the degree of thermal conduction from the printed circuit board 301 to the pyroelectric element 105 can be changed. By providing the space between the back surface of the pyroelectric element 105 and the printed circuit board 301, the pyroelectric element 105 is less affected by heat from the printed circuit board 301. Also, by holding the pyroelectric element 105 with the insulations, the pyroelectric element 105 has a floating structure, which is not connected to ground.

A plurality of connecting terminals 251 are formed on the upper surface of the IC 250. The connecting terminals 251 are connected to corresponding terminals of the first amplifier 201 and the second amplifier 202 provided in the IC 250. The connecting terminal 251 connected to the inverting input terminal of the first amplifier 201 is electrically connected to the first electrode terminal 111 of the pyroelectric element 105 via a bonding wire 313. The connecting terminal 251 connected to the inverting input terminal of the second amplifier 202 is electrically connected to the second electrode terminal 112 of the pyroelectric element 105 via another bonding wire 313. The other connecting terminals 251 are also electrically connected to the corresponding terminals via the bonding wires 313.

The first balanced output terminal 120, the second balanced output terminal 123, the voltage supply terminal 121, and the ground terminal 122, which are interface terminals for connecting external devices, are formed on a second surface (e.g., the back surface) of the printed circuit board 301 to form a surface mounted terminal structure. The interface terminals are electrically connected to the corresponding connecting terminals 251 in the IC 250. The ground terminal 122 is connected to the metal cap 302 via the printed circuit board 301, and the case 300 is connected to ground. Thus, the case 300 functions as a shield case shielding the inside of the case from external electromagnetic noise. While the cap can function as a shield, if it is a metal cap; the cap may not be made of metal.

An opening 302a is formed in the part of the metal cap 302 above to the pyroelectric element 105, and is bonded to an infrared transmissive member 304 to cover the opening 302a. As such, the infrared transmissive window 130 is formed, which guides infrared light to the pyroelectric element 105. The infrared transmissive member 304 may be made of silicon. It may also be made of sapphire or the like, on which germanium (Ge) or an optical filter is vapor-deposited. The metal cap 302 is bonded to the printed circuit board 301 by solder reflow or the like.

If the pyroelectric element 105 has a size of about 1.5 mm per side, and the IC 250 has a size of about 1 mm×0.5 mm, the infrared detector shown in FIGS. 4A-4C has a size of about 6 mm (W)×4 mm (D)×2 mm (H). A further reduction in the volume is possible, depending on the location and the sizes of the pyroelectric element 105 and the IC 250.

Figure 5A:
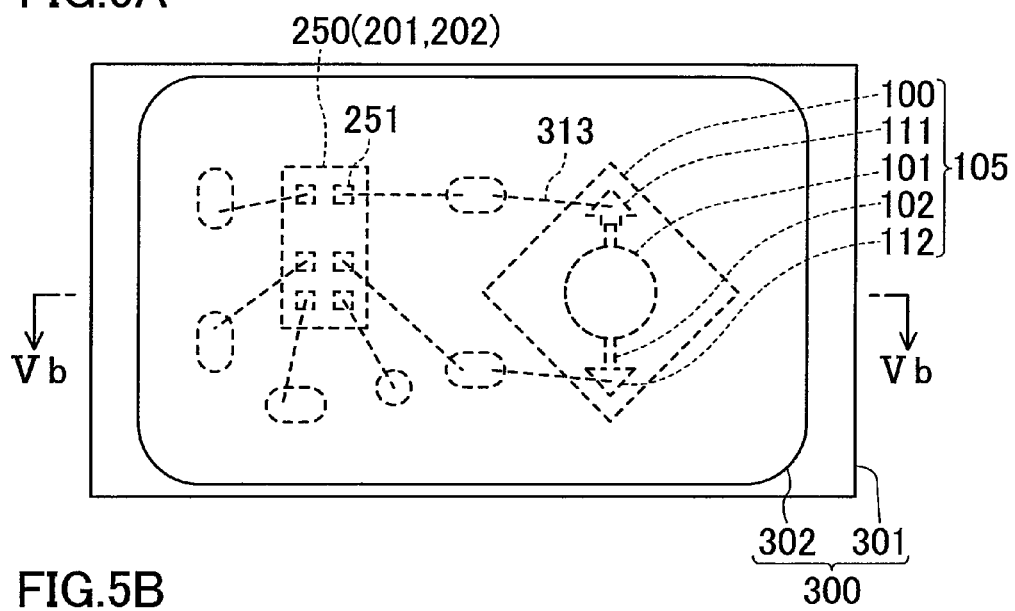
FIGS. 5A-5C illustrate a variation of the example infrared detector.
Figure 5B:
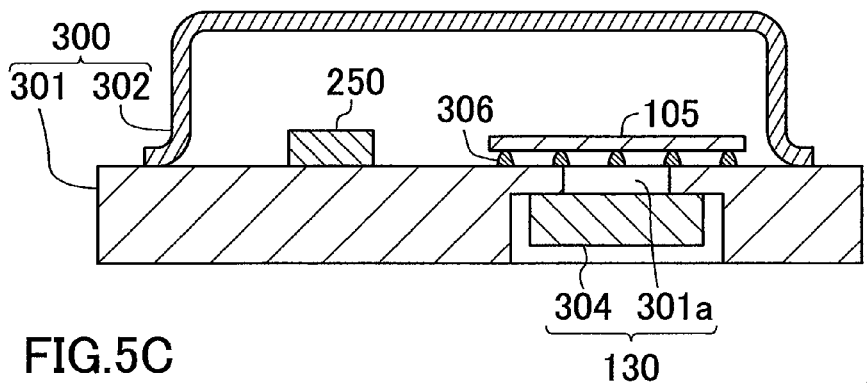
Figure 5C:
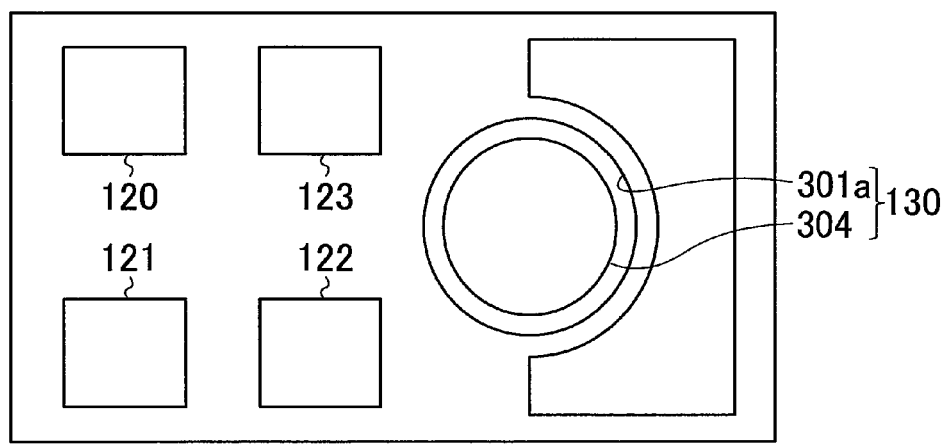

The infrared detector shown in FIGS. 4A-4C is configured to guide infrared light to the front surface of the pyroelectric element 105. However, as shown in FIG. 5, the infrared transmissive window 130 may include an opening 301a formed in the printed circuit board 301, and an infrared transmissive member 304 covering the opening 301a. In this case, infrared light is guided to the back surface of the pyroelectric element 105.

Output Signal Data

Figure 6:
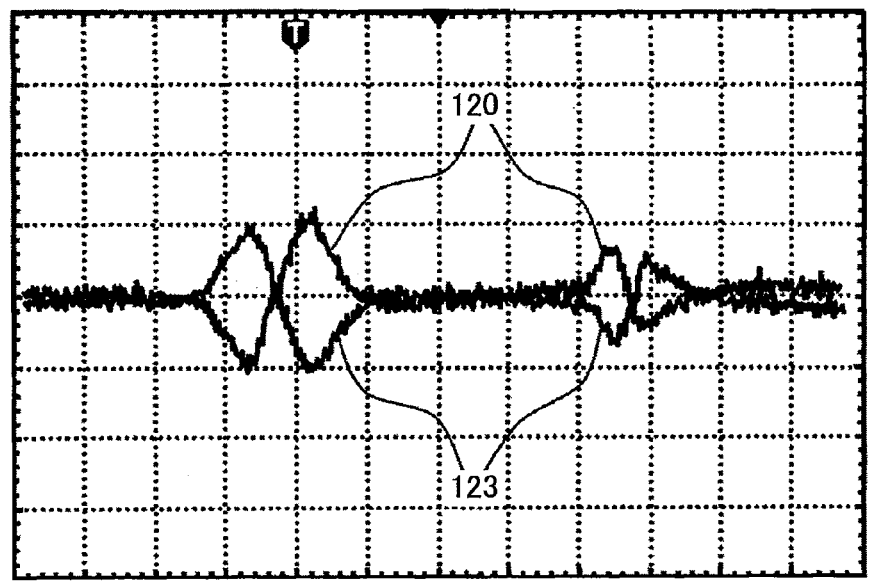
FIG. 6 is a graph illustrating outputs of the example infrared detector.

Next, output signals of the example infrared detector will be described below. FIG. 6 illustrates signals obtained where a thermal radiation source (soldering iron) emitting infrared light is transferred on the example infrared detector. Note that in the infrared detector used for the measurement, the capacitance $C_m$ of the pyroelectric element is 2 pF, and the feedback capacitance $C_f$ is 2.56 pF. An on-resistance of the CMOS type high-input impedance amplifier is used as the feedback resistance. An IC developed and tested by the present inventors is used as the CMOS type high-input impedance amplifier.

As shown in FIG. 6, the output waveform of the first balanced output terminal 120 and the output waveform of the second balanced output terminal 123 are complementary waveforms, which are the same in amplitude and opposite in phase.

Figure 7:
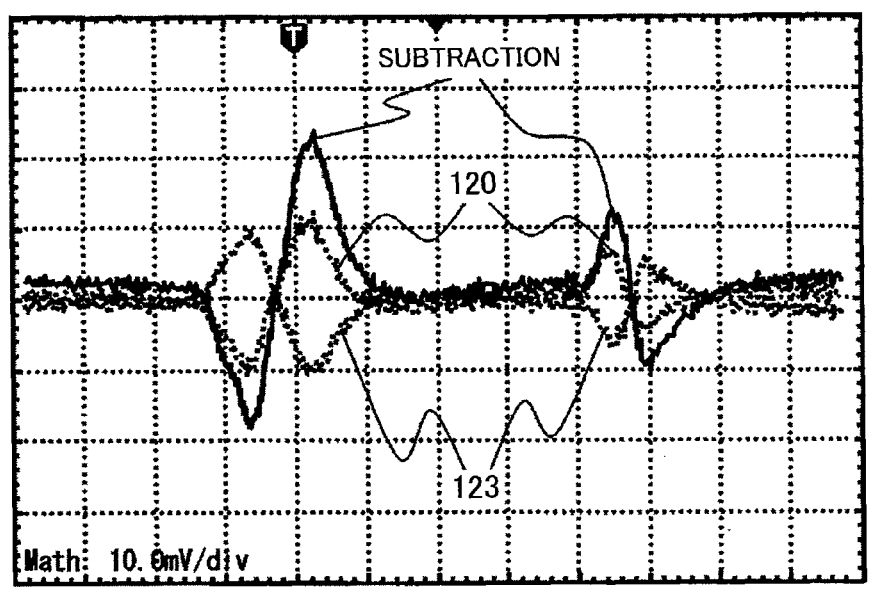
FIG. 7 is a graph illustrating a result of subtraction of the outputs of the example infrared detector.

FIG. 7 illustrates a result of a subtraction process on the signals in FIG. 6 using an oscilloscope. As shown in FIG. 7, the signals after the subtraction have twice as much magnitude as the outputs of the first balanced output terminal 120 and the second balanced output terminal 123.

Figure 8:
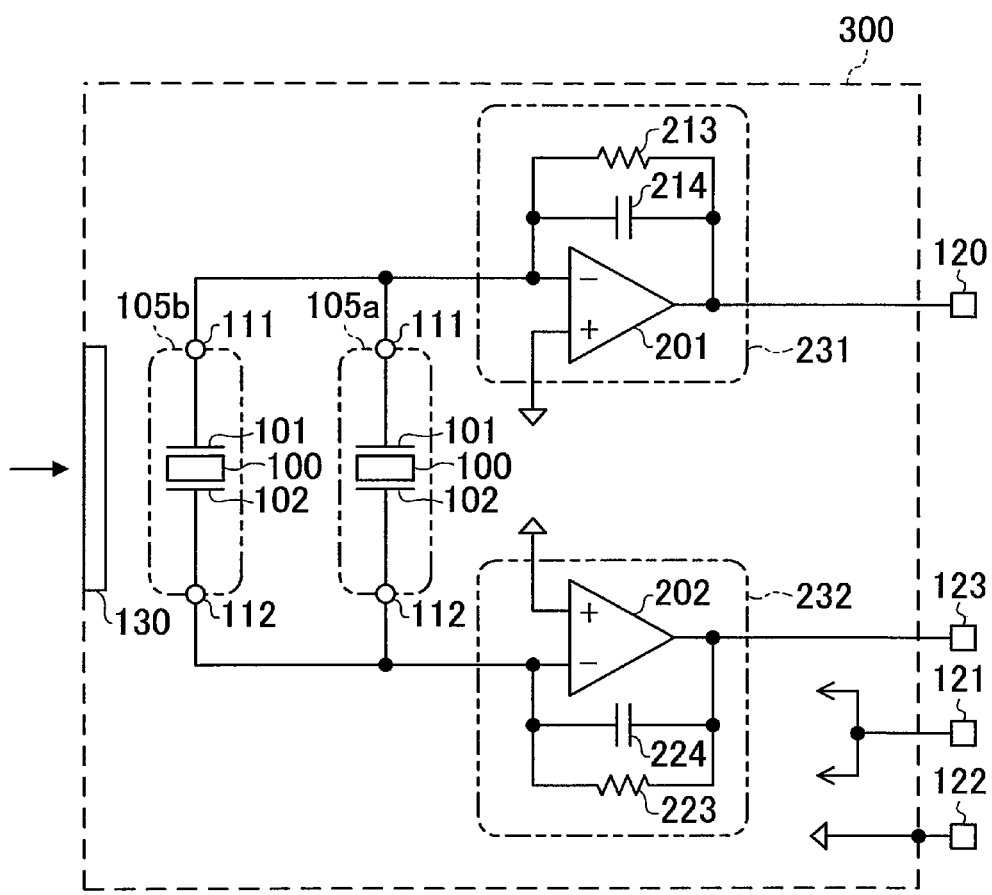
FIG. 8 is a circuit diagram illustrating a variation of the example infrared detector.

While an example has been described where a single pyroelectric element 105 is provided, a pyroelectric element 105a and a pyroelectric element 105b may be connected together in parallel as shown in FIG. 8. Due to this connection, the pyroelectric element 105a is not a load of the pyroelectric element 105b, and the pyroelectric element 105b is not a load of the pyroelectric element 105a. Since signals of the pyroelectric elements can be amplified without loss, and thus, the outputs can be doubled as compared to the case where a single pyroelectric element is used. Also, noise input to the pyroelectric elements in the same phase can be cancelled or reduced. While FIG. 8 shows the case where two pyroelectric elements are provided, three or more portions may be provided.

Figure 9:
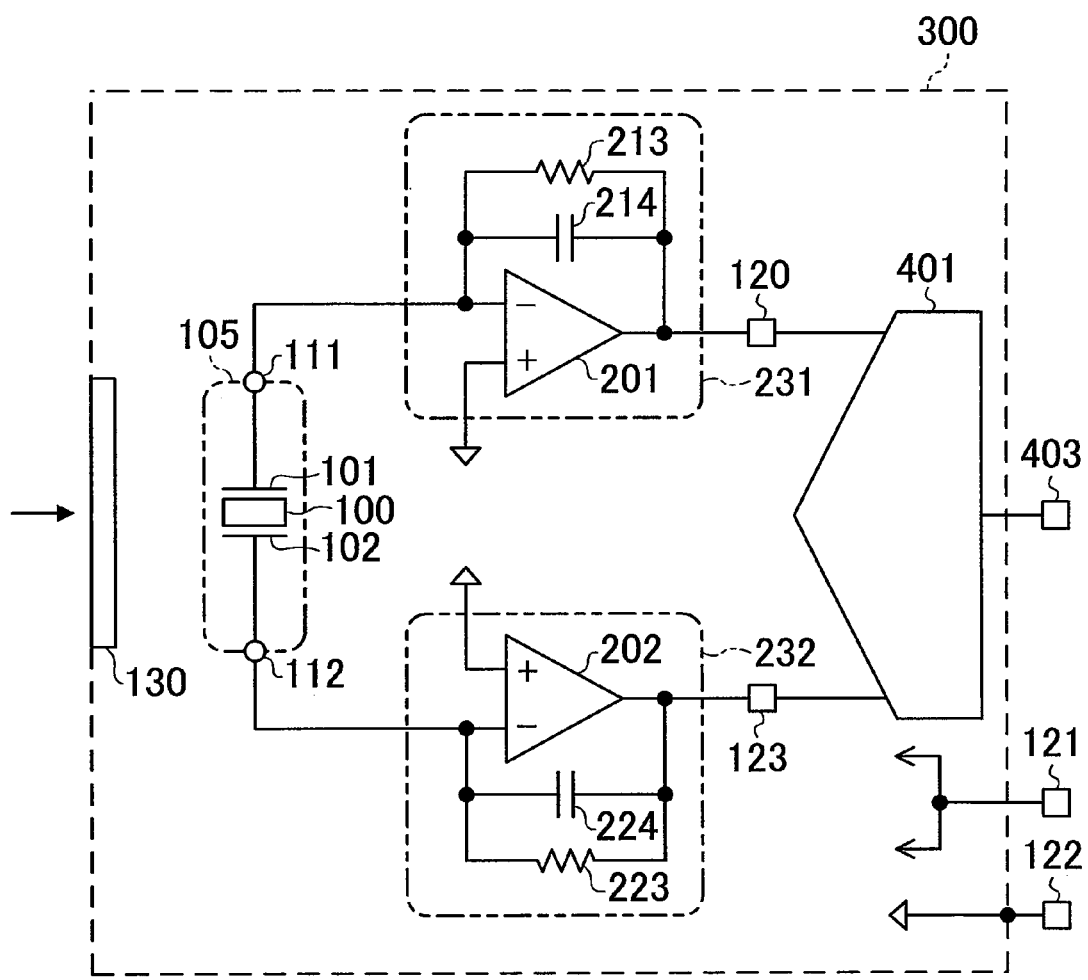
FIG. 9 is a circuit diagram illustrating a variation of the example infrared detector.

While an example has been described where analog signals are output, an analog/digital (AD) converter 401, which is connected to the first balanced output terminal 120 and the second balanced output terminal 123, may be provided as shown in FIG. 9 to output the signals as digital signals. For example, a ΔΣ modulation AD converter having high resolution may be used as the AD converter 401. In particular, a fourth order DEAD converter having a clock frequency ranging from 1 MHz to 4 MHz, and an oversampling ratio ranging from 50 to 64 times is preferably used, since it obtains a high signal-to-noise ratio in low power consumption.

By providing the AD converter 401, digital output signals in, e.g., a pulse density modulation (PDM) form, in which a waveform is represented by the density of a pulse having a constant width, can be obtained from an output terminal 403. By using a digital signal processor (DSP, not shown) provided outside the case 300, the digital output signals in the PDM form can be further converted to an SPDIF format, which is an audio interface format. Note that the DSP may be provided within a package of the case 300 together with the AD converter 401. By providing the DSP in the package of the case 300, the infrared detector can directly output digital output signals in, e.g., the SPDIF format. A plurality of pyroelectric elements may be provided as shown in FIG. 8.

What is claimed is:

1. An infrared detector, comprising:
    at least one pyroelectric element including a pyroelectric body and a first electrode and a second electrode formed on opposing surfaces of the pyroelectric body;
    a first amplifier connected to the first electrode, and amplifying signals induced to the first electrode; and
    a second amplifier connected to the second electrode, and amplifying signals induced to the second electrode.

2. The infrared detector of claim 1, further comprising a case housing the pyroelectric element, the first amplifier, and the second amplifier.

3. The infrared detector of claim 2, wherein
    the case includes a substrate on which the pyroelectric element, the first amplifier, and the second amplifier are mounted, and
a cap covering the substrate, and
the cap includes an infrared transmissive window through which infrared light is transmitted to the pyroelectric element.

4. The infrared detector of claim 2, wherein
the case includes
a substrate on which the pyroelectric element, the first amplifier, and the second amplifier are mounted, and
a cap covering the substrate, and
the substrate includes an infrared transmissive window through which infrared light is transmitted to the pyroelectric element.

5. The infrared detector of claim 3, wherein
the substrate includes a first balanced output terminal and a second balanced output terminal formed on a surface opposite to a surface on which the pyroelectric element is mounted,
the first balanced output terminal is connected to an output of the first amplifier, and
the second balanced output terminal is connected to an output of the second amplifier.

6. The infrared detector of claim 5, wherein
the cap is made of metal, and
the cap is electrically connected to ground terminal formed on the surface of the substrate opposite to the surface on which the pyroelectric element is mounted.

7. The infrared detector of claim 1, wherein
the at least one pyroelectric element includes multiple ones of the at least one pyroelectric element, and
the multiple pyroelectric elements are connected together in parallel.

8. The infrared detector of claim 1, wherein the first amplifier and the second amplifier are capacitively coupled charge amplifiers.

9. The infrared detector of claim 1, wherein the first amplifier and the second amplifier are integrated together.

10. The infrared detector of claim 1, wherein an output signal of the first amplifier and an output signal of the second amplifier are substantially opposite in phase.

11. The infrared detector of claim 1, wherein the first electrode is not connected to ground.

12. The infrared detector of claim 1, wherein the second electrode is not connected to ground.

13. The infrared detector of claim 1, further comprising a third amplifier performing subtraction between an output signal of the first amplifier and an output signal of the second amplifier.

14. The infrared detector of claim 13, wherein the first amplifier, the second amplifier, and the third amplifier are integrated together.

15. The infrared detector of claim 1, further comprising an analog/digital converter for performing analog/digital conversion of an output signal from the first amplifier and an output signal from the second amplifier.

16. The infrared detector of claim 15, wherein the first amplifier, the second amplifier, and the analog/digital converter are integrated together.

17. The infrared detector of claim 15, wherein the analog/digital converter is a $\Delta\Sigma$ converter.

18. The infrared detector of claim 15, wherein the analog/digital converter outputs a digital signal in a pulse density modulation form.

* * * * *